United States Patent
Dong et al.

(10) Patent No.: US 6,849,897 B2
(45) Date of Patent: Feb. 1, 2005

(54) TRANSISTOR INCLUDING SiON BUFFER LAYER

(75) Inventors: Zhong Dong, Sunnyvale, CA (US); Chuck Jang, Fremont, CA (US)

(73) Assignee: ProMOS Technologies Inc., Hsin-Chu (TW)

( * ) Notice: Subject to any disclaimer, the term of this patent is extended or adjusted under 35 U.S.C. 154(b) by 0 days.

(21) Appl. No.: 10/423,162

(22) Filed: Apr. 24, 2003

(65) Prior Publication Data

US 2004/0051135 A1 Mar. 18, 2004

Related U.S. Application Data

(62) Division of application No. 10/243,791, filed on Sep. 12, 2002.

(51) Int. Cl.[7] .............................................. H01L 29/78
(52) U.S. Cl. ...................................... 257/316; 438/261
(58) Field of Search ................................ 438/257–267; 257/315–324

(56) References Cited

U.S. PATENT DOCUMENTS

| | | | |
|---|---|---|---|
| 5,034,798 A | | 7/1991 | Ohsima |
| 5,726,087 A | * | 3/1998 | Tseng et al. ................ 438/261 |
| 5,856,221 A | | 1/1999 | Clementi et al. |
| 6,001,713 A | | 12/1999 | Ramsbey et al. |
| 6,187,633 B1 | | 2/2001 | Dong et al. |
| 6,271,091 B1 | * | 8/2001 | Park ........................... 438/267 |
| 6,355,524 B1 | | 3/2002 | Tuan et al. |
| 6,475,927 B1 | | 11/2002 | Thakur |

OTHER PUBLICATIONS

Lee, Yung–Huei, et al.., "Hot–Carrier Degradation of Sub-micrometer p–MOSFET's With Thermal/LPCVD Composite Oxide", vol. 40, No. 1, Jan., 1993.

Brown, William D. & Brewer, Joe E. "Nonvolatile Semiconductor Memory Technology: A Comprehensive Guide To Understanding And Using NVSM Devices", pp. 10–25; The Institute of Electrical and Electronics Engineers, Inc., New York.

Wolf, "Silicon Processing for the VLSI Era vol. 2: Process Integration", pp. 327–337, 1990, Lattice Press.

* cited by examiner

Primary Examiner—Richard A. Booth
(74) Attorney, Agent, or Firm—MacPherson Kwok Chen & Heid LLP

(57) ABSTRACT

A thin buffer layer of SiON is formed on the top surface of the floating gate, in order to protect the polysilicon surface from attack by atomic chlorine produced during the formation of the high temperature oxide of the ONO stack. The buffer layer can also be formed on other dielectric surfaces which are otherwise subject to adverse conditions in subsequent processing, such as the nitride layer in the ONO dielectric stack.

7 Claims, 3 Drawing Sheets

US 6,849,897 B2

TRANSISTOR INCLUDING SION BUFFER LAYER

CLAIM OF PRIORITY

This application is a Divisional of U.S. patent application Ser. No. 10/243,791, filed Sep. 12, 2002 entitled "METHOD FOR FORMING A PROTECTIVE BUFFER LAYER FOR HIGH TEMPERATURE OXIDE PROCESSING".

BACKGROUND OF THE INVENTION

The present invention relates to integrated circuits, and more particularly to nonvolatile integrated memories.

FIG. 1 shows a cross section of a stacked gate nonvolatile memory cell such as used in flash and non-flash electrically erasable programmable read only memories (EEPROM). Conductive floating gate 110, made of doped polysilicon, overlies monocrystalline silicon substrate 120. A dielectric material, e.g. silicon dioxide layer 130 insulates the floating gate 110 from the substrate. N type source/drain regions 140 in substrate 120 are separated by P type channel region 150 in substrate 120. Channel region 150 is directly below the floating gate. Dielectric layer 160 separates the floating gate from control gate 170 made of doped polysilicon.

The memory cell is read by applying a voltage between the regions 140, applying a voltage between one of the regions 140 and control gate 170, and detecting a current through the other one of the regions 140. The memory cell is written (programmed or erased) by modifying a charge on floating gate 110. Floating gate 110 is completely insulated on all sides. To modify the charge on the floating gate 110, electrons are transferred between the floating gate and substrate channel region 150 through oxide 130. The electrons can be transferred by Fowler-Nordheim tunneling or hot electron injection. See "Nonvolatile Semiconductor Memory Technology" (1998) edited by W. D. Brown and J. E. Brewer, pages 10–25, incorporated herein by reference. The electron transfer requires a voltage to be established between the floating gate and a substrate region (the substrate region can be channel 150 or a source/drain region 140). This voltage is established by creating a voltage between the substrate region and the control gate. The control gate voltage is coupled to the floating gate. To reduce the voltage required to be created between the substrate region and the control gate, a high capacitive coupling is needed between the floating and control gates. A high specific capacitance (capacitance per unit area) can be obtained between the floating and control gates by reducing the thickness of dielectric layer 160. However, dielectric layer 160 functions as a barrier to a charge leakage from the floating gate to the control gate. Therefore, dielectric layer 160 has to be a high quality, thin, uniform dielectric in order to provide good data retention (low leakage) and ensure a predictable high capacitive coupling between the floating and control gates.

Dielectric layer 160 can be silicon dioxide, $SiO_2$, as shown in FIG. 1. However, as the dimensions of the devices continues to shrink, the thickness of the $SiO_2$ layer must also decrease to maintain the same capacitance between the floating gate and the control gate. Thicknesses of less than 2 nm are expected in the future. However, the occurrence of high tunneling current through such thin layers of silicon dioxide requires that alternative materials be considered. ONO (silicon dioxide, silicon nitride, silicon dioxide) has been used. The nitride layer has a higher dielectric constant than silicon dioxide, thus increasing the capacitive coupling between the floating gate and the control gate. The higher capacitive coupling allows a thicker layer to be used to reduce leakage current without diminishing the capacitive coupling.

However, a particular difficulty occurs with the formation of the high temperature oxide (O) of the ONO, wherein the deposition technique of the high temperature oxide makes use of dichlorosilane $SiCl_2H_2$ gas which reacts with nitrous oxide $N_2O$, to form hydrochloric acid HCl and $N_2$ as well as silicon dioxide $SiO_2$. The hydrochloric acid is highly corrosive, and attacks the bare surface of silicon and polysilicon, leaving a rough surface with poor uniformity. The rough surface morphology compromises the integrity of the dielectric film, by forming areas of varying thickness and high field concentration. This variability adversely affects the reliability of the device, in terms of leakage current, breakdown voltage, and lifetime. A new approach is needed.

SUMMARY

This section summarizes some features of the invention. The invention is defined by the appended claims that are incorporated into this section by reference.

In a first embodiment of the invention, a surface of a silicon or polysilicon layer may be reacted with $N_2O$ to form a thin buffer layer of SiON at a thickness of less than 2 nm, before deposition of a high temperature oxide film. The high temperature oxide deposition process may then proceed as before, with the thin SiON film protecting the silicon surface from reaction with the chlorine gas produced by the high temperature oxide process. The invention can be applied to a number of transistor geometries, including low voltage gate oxides and interpoly dielectric layers which insulate the floating gate from the control gate of the non-volatile memory device.

Optionally, the SiON buffer layer can be grown on other layers requiring such protection, such as the nitride layer of the ONO stack of the interpoly dielectric layer.

In some embodiments, the additional SiON buffer layer may be formed by introducing a pre-purge period in which the reaction chamber is purged with $N_2O$ for a period of 10–20 minutes at a temperature of 750° C. This pre-purge period allows the SiON buffer film to grow on the bare silicon surfaces. This nitrogen-containing film may form an effective barrier against the chlorine compounds. After the pre-purge period, the dichlorosilane is introduced into the chamber to form the high temperature oxide as usual. Therefore, the addition of the pre-purge process step may be conveniently integrated into existing process flows.

Alternatively, the oxide may be formed by introducing oxygen gas $O_2$ into the chamber at 750° C. for 10–20 minutes, to form a thin $SiO_2$ layer.

These and other aspects of the present invention will be more apparent by consideration of the following detailed description and the accompanying drawings.

BRIEF DESCRIPTION OF THE DRAWINGS

In several figures, common features typically have the same reference numbers.

DETAILED DESCRIPTION

Figure 2:
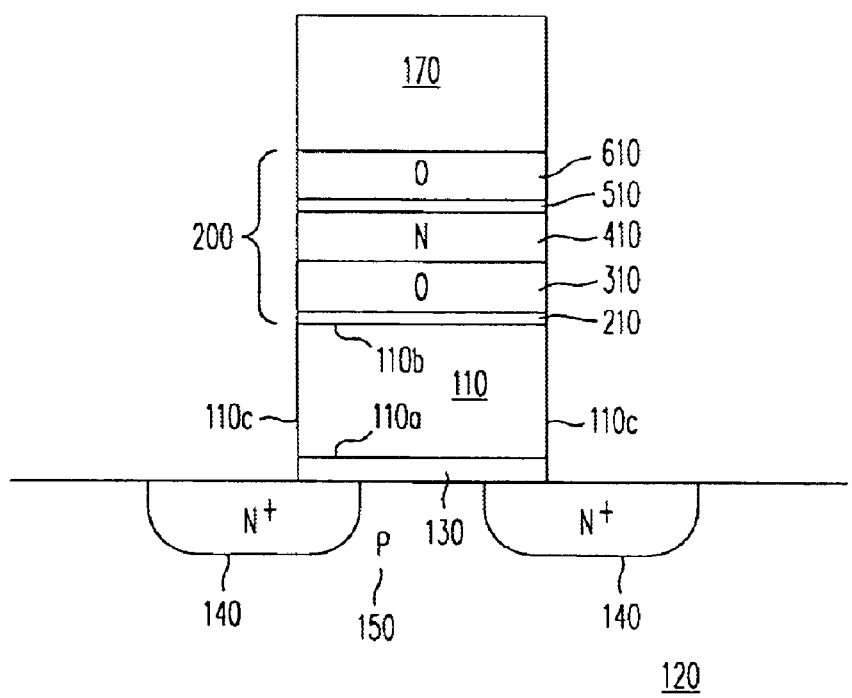
FIG. 2 shows a cross section of nonvolatile memory cells in a process of fabrication according to an embodiment of the present invention.

FIG. 2 illustrates a cross section of a nonvolatile memory cell at an intermediate stage of fabrication. In the illustrative embodiment being described, substrate 120 is a suitably doped (e.g. p-doped) monocrystalline silicon substrate. Appropriate wells (not shown) have been formed in the substrate, as described in U.S. Pat. No. 6,355,524 entitled "Nonvolatile Memory Structures and Fabrication Methods", which was filed Aug. 15, 2000 by H. T. Tuan et al., and is incorporated herein by reference. Other types of substrates, including non-silicon substrates, can also be used. The invention is not limited by any particular wells or doping types.

Semiconductor substrate 120 (monocrystalline silicon or some other material) is processed to form a suitably doped channel region 150 (type P in FIG. 2, but an N type channel can also be used). Dielectric 130 is formed on substrate 120 over channel 150. Dielectric 130 may be thermally grown silicon dioxide or some other type of dielectric, and is known as "tunnel oxide" because the memory cell can be erased by the Fowler-Nordheim tunneling of electrons from the floating gate to substrate 120. In some embodiments, the oxide is grown at around 800° C., by dry oxidation to a thickness of 9 nm. The invention is not limited to Fowler-Nordheim tunneling or silicon dioxide.

Then polysilicon layer 110 is deposited on top of the tunnel oxide, and is doped during or after deposition. The polysilicon layer can be fabricated using, for example, a POLYGEN chamber manufactured by Applied Materials, Inc. of Santa Clara, Calif. The polysilicon layer may be 150 nm thick, deposited by low pressure chemical vapor deposition (LPCVD) and doped with phosphorus to a concentration of 1E20–5E20 atoms/cm$^3$. The dopant may be applied using a gas mixture comprising SiH$_4$/PH$_3$ at 610° C., at 250–300 Torr.

Polysilicon layer 110 will provide the floating gates and, possibly, other circuit elements as needed for the peripheral circuitry. Such elements may include interconnects, transistor gates, resistors and capacitor plates.

A dielectric layer 200 is typically deposited over the floating gate. One embodiment for the dielectric layer 200 is an ONO multilayer, wherein a high temperature oxide is formed over the polysilicon floating gate, followed by silicon nitride, followed by another layer of high temperature oxide. This structure is often called an ONO interpoly dielectric since it is sandwiched between the phosphorous doped polysilicon layer 110 which constitutes the floating gate for a flash memory cell, and an overlying second polysilicon layer 170, which forms the control gate for the cell. The first and third layers 310 and 610 of the interpoly dielectric layer 200 are the silicon dioxide layers which are formed by a high temperature oxidation (HTO) process. The middle layer 410 of the interpoly dielectric is the silicon nitride material, which increases the dielectric constant of the dielectric layer 200.

As mentioned, the process of high temperature oxidation introduces dichlorosilane into the reaction chamber to react with N$_2$O, and this process releases chlorine gas that can attack the polysilicon surface 110, leaving a roughened surface morphology. By forming first a thin layer of SiON, according to this invention, on the surface of the polysilicon layer 110, the surface of polysilicon layer 110 may be protected from the chlorine, so that it retains its uniform surface morphology and resistance to leakage current.

In a first embodiment of the invention, a buffer layer of SiON 210 (FIG. 2) may be formed on polysilicon layer 110 by reacting N$_2$O gas with the substrate in a reaction chamber at 100–400 mTorr, for 10–20 minutes. The N$_2$O gas may be provided at a rate of 30–100 sccm (standard cubic centimeters per minute), while the substrate is maintained at a temperature of 700–800° C. The buffer layer formed in this period is thin, e.g., between 1 to 2 nm. In particular, the protective SiON buffer layer has a thickness suitable to minimize or prevent chlorination of the first polysilicon layer during formation of the high temperature oxide layers. In this embodiment, the SiON layer may have a thickness of about 2 nm. As shown in FIG. 2, a lower surface 110$a$ of the polysilcon layer 110 is over and contacts dielectric layer 130. The buffer layer 210 contacts an upper surface 110$b$ of polysilicon layer 110. The vertical side surfaces 110$b$ of the patterned floating gate are not covered by the buffer layer 110.

While the concentration of nitrogen in the buffer layer is low, on the order of 1%, it may be sufficient to impact the growth rate of subsequently deposited films on top of the SiON buffer layer. In fact, subsequent oxide layers may grow at a rate of $\frac{1}{10}$ their rate on pure silicon surfaces. This can be useful, since in order to continue to make smaller devices, it becomes necessary to control the thickness of very thin films, which is easier when the film growth rate is slow compared to when it is rapid.

In another embodiment, an increase in nitrogen concentration may be obtainable by substitution of ammonia NH$_3$ for the N$_2$O reactant gas. The increased nitrogen concentration may provide an even more effective barrier to penetration by chlorine and other reactive compounds.

In another embodiment, a pure oxide buffer layer 210 can be formed by introducing O$_2$ at 30–100 sccm to the reaction chamber at 100–400 mTorr and 750° C.

In either case, the high temperature oxide layers 310 and 610 may then be formed as usual, e.g., by the introduction of SiCl$_2$H$_2$ at a flow rate of about 10–30 sccm, and a total chamber pressure of 150–500 mTorr. The SiCl$_2$H$_2$ reacts with the nitrous oxide gas already in, or provided to the chamber at a flow rate of 30–100 sccm, to deposit the high temperature SiO$_2$ film to a thickness of about 3–15 nm at 750° C. Other thicknesses, processes, and process parameters may also be used. FIG. 2 shows the silicon oxide layer 310 to be on top of layer 210 and 110.

Therefore, the formation of the protective buffer layer was performed as a pre-purge step, wherein the N$_2$O gas is admitted to the chamber for 10–20 minutes before the SiCl$_2$H$_2$ gas is introduced to deposit the high temperature oxide. This pre-purge step is conveniently added to the process flow to deposit the high temperature oxide.

Figure 3:
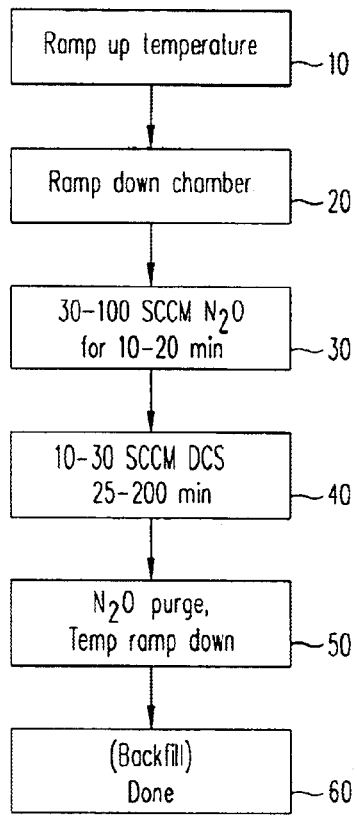
FIG. 3 shows a simplified flow chart which describes the process according to the invention.

An exemplary process flow is shown in FIG. 3. As a first step 10, the wafer is brought up to the processing temperature of 700C to 800C. The chamber is pumped down after the wafer is brought to temperature. Next in step 30, the N$_2$O reagent gas is admitted into the chamber at 30–100 sccm for 10 to 20 minutes, the time necessary to form the 2 nm thick buffer film. In step 40 the high temperature oxide is formed by admitting dichlorosilane into the processing chamber for 25 to 200 minutes. After the high temperature oxide has formed, in step 50 the chamber is purged with $N_2O$ and the temperature is ramped down. The process is complete at this step, and the chamber can be backfilled with an inert gas.

The middle layer 410 of the multilayer structure of the interpoly dielectric 200 is a silicon nitride film formed by, for example, LPCVD. The deposition process may include, for example, provision of 30 sccm of dichlorosilane and 90 sccm of ammonia at a total pressure of about 150 mTorr. The temperature in the chamber may be kept the same as in the previous process steps, that is, at 750° C.

Optionally, as shown, another protective layer 510 of SiON can be formed, if desired, on the top surface of the silicon nitride layer 410, by reaction of the surface with $N_2O$ as described above for the first SiON layer. However, due to slow growth rates, the SiON layer 510 may only be about 0.5 nm thick. The benefits of the presence of nitrogen at the boundary for protection from chlorine still exist, however, even for such thin layers. Such a film is designated as 510 in FIG. 2. An exemplary thickness of SiON layer 510 is 0.5 to 1 nm, formed by exposing the wafer to 30–100 sccm of $N_2O$ at 100–400 mTorr for 10–20 minutes and 750° C. Other thicknesses, processes, and process parameters may also be used.

A final high temperature silicon oxide layer 610 completes the ONO interpoly dielectric layer 200. As described previously, high temperature oxidation can be performed at 750° C. by reacting dichlorosilane $SiH_2Cl_2$ in an $N_{20}$ atmosphere at 150–500 mTorr. An exemplary thickness of the high temperature silicon oxide layer is 4 nm.

Therefore, in one embodiment, the overall thickness of the $SiON/HTO/Si_3N_4/SiON/HTO$ stack of interpoly dielectric layer 200 is 2+5+8+1+4 nm=20 nm in one embodiment.

The films 110, 210, 310, 410, 510, and 610, shown in FIG. 2, maybe annealed during the activation of the polysilicon doping, or optionally, an additional anneal process can be inserted at this point in the fabrication of the device, if it is found that the device has a higher breakdown voltage or less leakage current with the inclusion of such an anneal. The annealing process densifies the films and increases the bond strengths. One such anneal process may be a rapid thermal anneal (RTA) that occurs at 950–960 C at a pressure of 1 to 500 Torr of Ar for 30 seconds.

Known techniques can be used to complete the memory fabrication. Doped polysilicon 170, or some other conductive material, is deposited to provide the control gates (possibly wordlines each of which provides the control gates for a row of memory cells). The layers 170, 610, 510, 410, 310, 210 and 110 are then patterned as needed, using an etch process.

In one such process, a photoresist mask may be applied to the top surface of polysilicon layer 170. The mask protects the areas underneath the mask and exposes the unwanted areas to an etchant. A $Cl_2$/HBr chemistry plasma etch may be used to etch the top polysilicon layer 170. The sub-layers 610, 510, 410, 310, and 210 of interpoly dielectric 200 may be etched using 50 sccm of chlorine gas $Cl_2$ with argon flowing at 100 sccm, and total chamber pressure of 6 mTorr. Lastly, the bottom polysilicon layer 110 may be etched using a $Cl_2$/HBr chemistry plasma etch. The interpoly dielectric layer 200 and polysilicon layers 170 and 110 may be etched through the mask openings to form strips extending in the bitline direction through the memory array.

Source/drain regions 140 are formed by doping. Additional layers (not shown) may be formed to provide select gates, erase gates, or other features.

Figure 1:
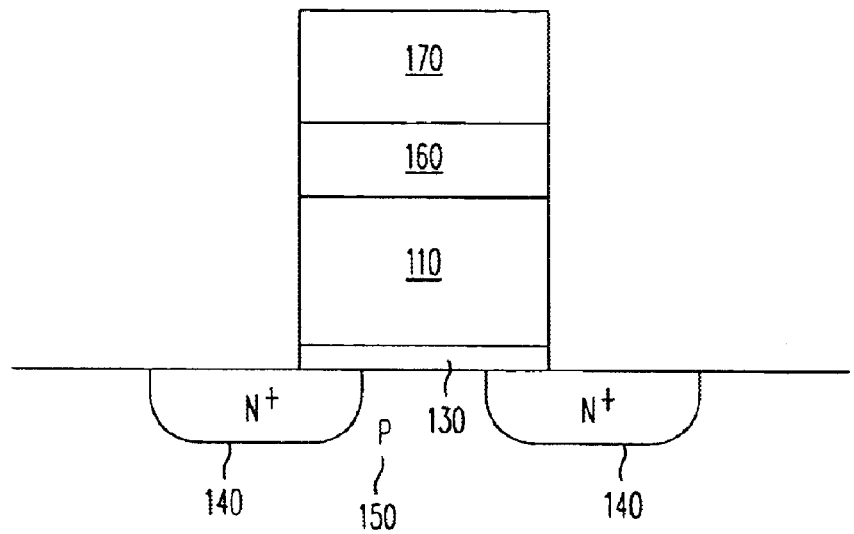
FIG. 1 shows a cross section of a prior art nonvolatile memory cell.

The memory cell of FIG. 2 can be operated like the memory cell of FIG. 1. The memory can be programmed by Fowler-Nordheim tunneling of electrons from channel 150 or source/drain region 140 to floating gate 110. The memory can be erased by Fowler-Nordheim tunneling of electrons from the floating gate to channel 150 or a source/drain region 140. In other embodiments, the memory is programmed by hot electron injection, and erased by Fowler-Nordheim tunneling. In still other embodiments, the memory is erased by tunneling of electrons from the floating gate to a separate erase gate (not shown). Other memory structures, including split gate structures with select gates, and other programming and erase mechanisms, known or to be invented, can also be used.

The methods described above in relation to FIG. 2 can also be applied to other geometries of silicon transistors. Another embodiment of the invention is illustrated using FIG. 4, which shows a gate of a MOSFET transistor. This embodiment pertains to the formation of thin film PMOS low voltage gate oxides, layers labeled 210 and 220 in FIG. 4. In the prior art, a significant problem was encountered in the fabrication of these thin oxides, as migration of the dopant species from the gate 230 to the substrate 120. Once in the substrate, the dopant species changes the concentration of charge carriers in the substrate, and therefore alters the voltage threshold of the device. Typically, the threshold voltage must be controlled to within about 0.1V, and therefore the number of excess charge carriers must be substantially less than 1e13 $cm^{-3}$. For thin oxide devices, it has been difficult to control the dopant diffusion across very thin oxide barriers to this level.

Figure 4:
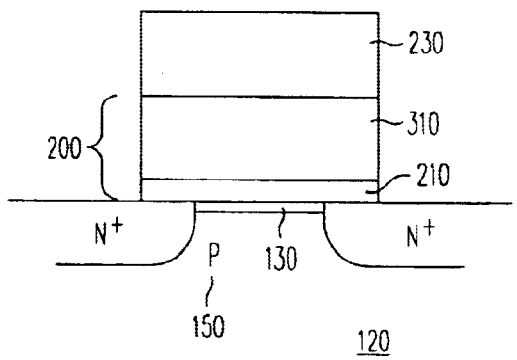
FIG. 4 shows a cross section of a gate oxide layer in the process of fabrication according to an embodiment of the present invention.

In one embodiment, the present invention addresses the problem by the formation of a thin buffer film of SiON on the silicon substrate, which may provide an effective barrier against diffusion of dopant (e.g., boron) from the conductive polysilicon gate 230 to the substrate 120. It may therefore help to control the concentration of carriers in the substrate, which leads to greater control over the threshold voltage of the transistor. This embodiment is shown in FIG. 4, wherein a 1 nm buffer layer 210 of SiON is shown overlying source/drain regions, 140 and channel region 150. The buffer layer 210 may be formed by flowing 30–100 sccm of $N_2O$ through the reaction chamber at 150–500 mTorr, at 750° C., for 10–20 minutes. Thereafter, the dichlorosilane may be introduced to the chamber to form the high temperature oxide 220. The thickness of buffer layer 210 may vary. Finally, the doped polysilicon gate 230 may be deposited and patterned as usual. In this embodiment, the buffer layer also provides a barrier against hot electron current, which may also degrade the device performance.

Figure 5:
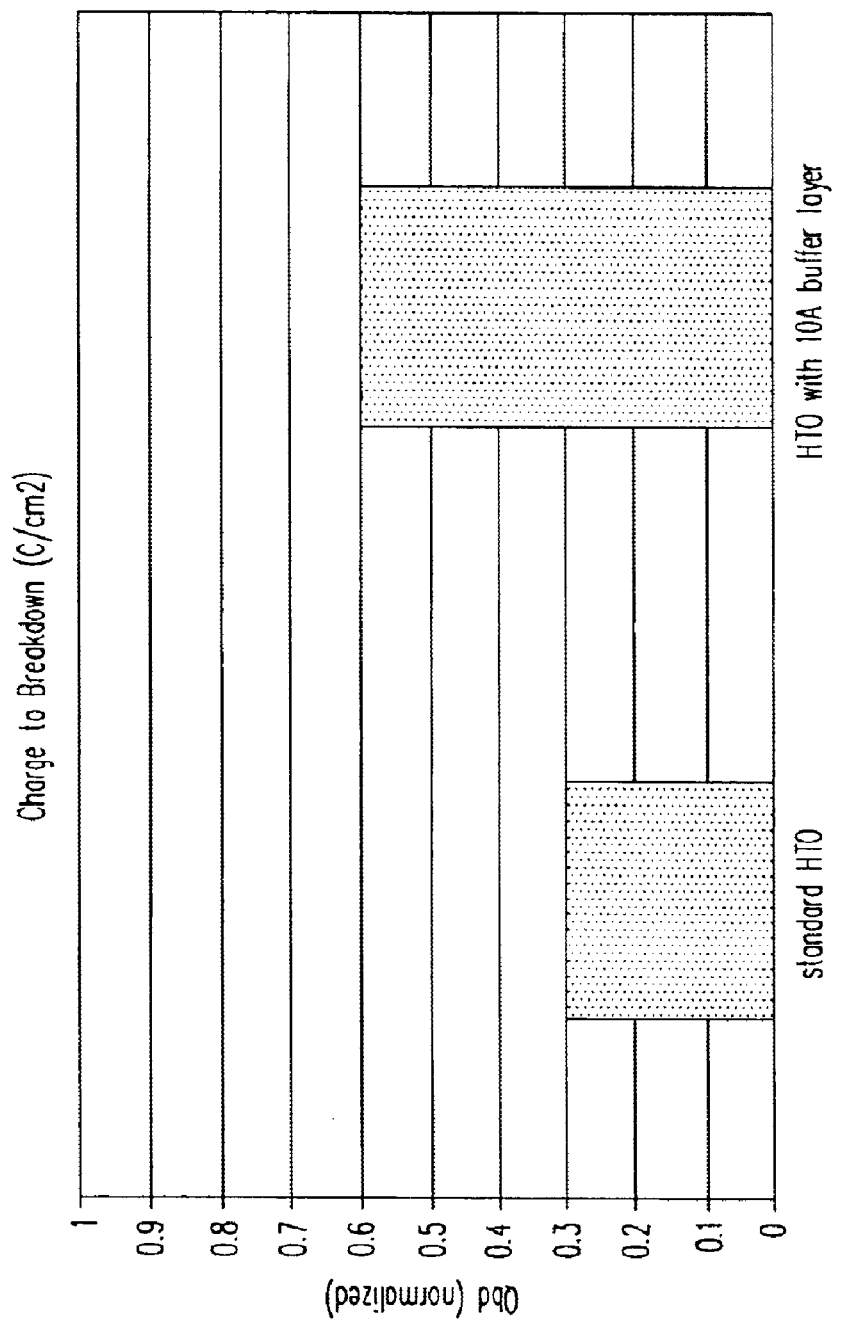
FIG. 5 shows data demonstrating the improved charge-to-breakdown performance of the invention as described.

The use of a SiON buffer layer 210 in addition to the high temperature oxide layer 310 typically does not lead to a significant change in the total physical thickness of dielectric layer 200. However, the superior quality of the surface 210 under the high temperature silicon oxide 310, may result in improved lifetime and reliability of the memory device. For example, FIG. 5 shows data indicating the charge stored before breakdown for the high temperature oxide layer 310 with a SiON buffer layer 210 (see FIG. 4), compared to the usual high temperature oxide film alone. The charge-to-breakdown measured on the device without the buffer layer is 1.5 $C/cm^2$, whereas the charge-to-breakdown on the device with the buffer layer is 3.0 $C/cm^2$. The device measured in FIG. 5 was a 0.1 $mm^2$ capacitor wherein a polysilicon gate 230 is separated from a silicon substrate 120 by a 5 nm high temperature oxide layer 310 with and without a 1 nm buffer layer 210. Therefore, a factor of two improvement in the charge to breakdown is measured for the high temperature oxide with the buffer layer as described in this invention, compared to the prior art.

In yet another embodiment, a buffer layer may be applied to gate oxides which use a composite oxide, i.e. a high temperature oxide plus a thermally grown oxide barrier. An example of such a composite oxide occurs in select gate transistors, such as that shown in FIG. 6. The select gate is used to select a subset of memory cells in an array for erasing or programming. The select gate 340 is insulated from the floating gate 370 and control gate 380 by a nitride side wall insulator 390. The select gate 340 is further insulated from the substrate surface by an oxide barrier 350.

The present invention pertains to the construction of the oxide barrier 350.

According to the prior art, the oxide barrier is a composite oxide of first layer of 6–10 nm of thermal oxide, followed by the deposition of a layer of 3–6 nm of high temperature oxide. The thermal oxide is deposited first in order to protect the silicon surface from attack by the chlorine gas associated with the high temperature oxide deposition. Finally the select gate 340 is deposited with polysilicon to a depth of 200–300 nm. However the electrical quality of the stack as manufactured according to the prior art is not ideal, in that it has a breakdown voltage of 12 MV/cm and a charge to breakdown of only 0.1 C/cm$^2$. Part of the reason for the poor results is the fact that the high temperature oxide film is not annealed. Annealing is generally performed in order to densify the film and increase the bond strength. While annealing can be done to improve the performance of the oxide layer, annealing also promotes diffusion of the constituents of previously deposited layers. In general, exposure of the films to high temperatures needs to be minimized.

Figure 6:
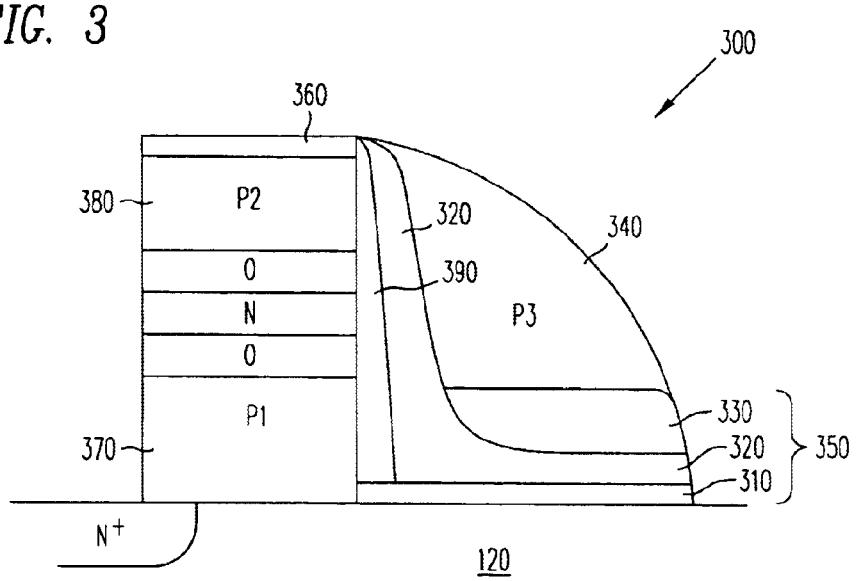
FIG. 6 shows a cross section of a select gate nonvolatile memory device in the process of fabrication according to an embodiment of the present invention.

These performance figures of merit are improved by embodiments of this invention, which call for the deposition of a first buffer layer 310 (see FIG. 6) of SiON on the surface of substrate 120, by exposure of the wafer to N$_2$O gas at 30–100 sccm and 150–500 mTorr pressure, followed by the deposition of high temperature oxide 320, as shown in FIG. 6. This embodiment also uses a composite oxide, in which a layer of 7 nm thick thermal oxide 330 is grown upon the high temperature oxide 320.

In contrast to the prior art, by first applying a buffer layer 310 to the substrate surface 120, the high temperature oxide 320 may be deposited upon the buffer layer, before the thermal oxide 330 is deposited. Therefore, damage to the substrate surface 120 is avoided by the presence of the protective buffer layer 310, which will also further protect against charge leakage from the select gate 340 to the substrate 120. Fabrication of the composite oxide is completed by growing the thermal oxide 330 on top of the high temperature oxide 320. Using this process, an additional anneal of the high temperature oxide may not be required, as it is performed during the growth of the thermal oxide. Elimination of an additional anneal step may be a significant benefit to the other structures already existing on the substrate surface, by avoiding additional exposure of the wafer to high temperatures. In fact, for the device fabricated as described here, the electrical performance figures of merit are a breakdown field of 15 MV/cm$^2$, and charge to breakdown of 3.0 C/cm$^2$, a significant improvement relative to the prior art.

In view of the above discussion, practitioners will appreciate that, among other possibilities, the invention is applicable to split-gate memories and other flash and non-flash floating gate memories, known or to be invented. It is also applicable to the formation of high voltage and low voltage gate oxides as well as interpoly oxide films. Other applications, of course, are not excluded.

The invention is not limited to the embodiments described above. The invention is not limited to the particular silicon dioxide deposition techniques or process parameters, layer thicknesses, or other details. The invention is not limited to the particular shape of the floating and control gates or their positioning relative to each other. The invention is not limited to particular materials. For example, polysilicon 110 can be replaced with amorphous silicon, monocrystalline silicon, or their combinations. Other embodiments and variations are within the scope of the invention, as defined by the appended claims.

What is claimed is:

1. An integrated circuit comprising a nonvolatile memory cell, said integrated circuit comprising:

a channel region in a semiconductor substrate;

a first dielectric layer on a surface of the channel region;

a floating gate of polysilicon on the first dielectric layer;

a first buffer layer of SiON in contact with the floating gate;

a second dielectric layer comprising a first layer of high temperature oxide in contact with the first buffer layer, a layer of silicon nitride on the first layer of the high temperature oxide, and a second layer of high temperature oxide on the layer of silicon nitride; and a control gate of polysilicon separated from the floating gate by the first buffer layer and the second dielectric layer, wherein the floating gate has a lower first surface covering and in contact with the first dielectric layer, an upper second surface covered by and in contact with the first buffer layer, and peripheral side surfaces extending vertically between the first and second surfaces, the side surfaces not being covered by the first buffer layer.

2. The integrated circuit of claim 1, wherein further comprising a second buffer layer in contact with the silicon nitride layer and between the silicon nitride layer and the second layer of the high temperature oxide.

3. The integrated circuit of claim 2, wherein the second buffer layer is SiON.

4. The integrated circuit of claim 1, further comprising:

a select gate of polysilicon over the surface of the channel region adjacent the floating gate and the control gate, and separated from the floating gate and the control gate by a third dielectric layer; and a second buffer layer of SiON in contact with the surface of the channel region;

a third layer of a high temperature oxide in contact with the second buffer layer, wherein the third layer of the high temperature oxide is between the second buffer layer and the select gate.

5. The integrated circuit of claim 4, further comprising a thermal oxide layer between the third layer of the high temperature oxide and the select gate.

6. The integrated circuit of claim 1, further comprising:

a second buffer layer of SiON in contact with the surface of the channel region and between the floating gate and the channel region.

7. An integrated circuit comprising a nonvolatile memory cell, said integrated circuit comprising:

a channel region in a semiconductor substrate between source and drain regions;

a floating gate of polysilicon over a surface of the channel region;

a control gate over the floating gate, wherein a dielectric layer is between the floating gate and the control gate;

a select gate of polysilicon over the surface of the channel region adjacent the floating gate and the control gate, and separated from the floating gate and the control gate by a dielectric layer;

a buffer layer of SiON in contact with the surface of the channel region and between the surface of the channel region and the select gate; and a layer of a high temperature oxide in contact with the buffer layer and between the buffer layer and the select gate, wherein the floating gate has a lower first surface facing the channel region, an upper second surface opposite the lower first surface, and peripheral side surfaces extending vertically between the first and second surfaces, and further comprising:

a second buffer layer of SiON over and in contact with the upper second surface of the floating gate and between the dielectric layer and the control gate, wherein the side surfaces of the floating gate are not covered by the second buffer layer.

* * * * *